United States Patent
Itagaki et al.

(10) Patent No.: US 9,110,371 B2
(45) Date of Patent: Aug. 18, 2015

(54) PHOTOSENSITIVE RESIN COMPOSITION, PHOTOSENSITIVE ELEMENT, METHOD FOR FORMING RESIST PATTERN AND METHOD FOR PRODUCING WIRING BOARD

(71) Applicant: Hitachi Chemical Company, Ltd., Tokyo (JP)

(72) Inventors: Katsutoshi Itagaki, Hitachi (JP); Masanori Shindou, Hitachi (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 0 days.

(21) Appl. No.: 14/403,233

(22) PCT Filed: May 28, 2013

(86) PCT No.: PCT/JP2013/064782
§ 371 (c)(1),
(2) Date: Nov. 24, 2014

(87) PCT Pub. No.: WO2013/180131
PCT Pub. Date: Dec. 5, 2013

(65) Prior Publication Data
US 2015/0153647 A1    Jun. 4, 2015

(30) Foreign Application Priority Data
May 31, 2012    (JP) .................. 2012-125516

(51) Int. Cl.
*G03F 7/032*    (2006.01)
*H05K 3/06*    (2006.01)
*H05K 3/10*    (2006.01)
*G03F 7/085*    (2006.01)
*G03F 7/20*    (2006.01)
*H05K 3/24*    (2006.01)
*H05K 3/18*    (2006.01)

(52) U.S. Cl.
CPC  *G03F 7/085* (2013.01); *G03F 7/20* (2013.01); *H05K 3/064* (2013.01); *H05K 3/108* (2013.01); *H05K 3/184* (2013.01); *H05K 3/241* (2013.01)

(58) Field of Classification Search
None
See application file for complete search history.

(56) References Cited

U.S. PATENT DOCUMENTS

| | | | |
|---|---|---|---|
| 5,496,682 A * | 3/1996 | Quadir et al. | 430/269 |
| 2004/0175653 A1 * | 9/2004 | Zuang et al. | 430/280.1 |
| 2005/0267230 A1 * | 12/2005 | Esaki et al. | 522/172 |
| 2009/0297981 A1 * | 12/2009 | Itagaki et al. | 430/286.1 |

FOREIGN PATENT DOCUMENTS

| | | |
|---|---|---|
| WO | 2006/016658 A2 | 2/2006 |
| WO | 2008/015754 A1 | 2/2008 |

* cited by examiner

*Primary Examiner* — Cynthia Hamilton
(74) *Attorney, Agent, or Firm* — Fitch, Even, Tabin & Flannery LLP

(57) ABSTRACT

Provided is a photosensitive resin composition, including: a binder polymer; a photopolymerizable compound having an ethylenically unsaturated group; a photopolymerization initiator; a benzotriazole compound; and an aliphatic diamine compound having from 8 to 30 carbon atoms.

10 Claims, 1 Drawing Sheet

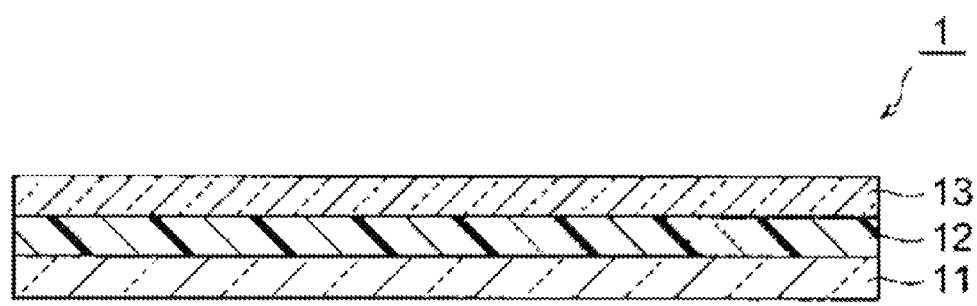

PHOTOSENSITIVE RESIN COMPOSITION, PHOTOSENSITIVE ELEMENT, METHOD FOR FORMING RESIST PATTERN AND METHOD FOR PRODUCING WIRING BOARD

TECHNICAL FIELD

The present invention relates to a photosensitive resin composition, a photosensitive element, a method of forming a resist pattern and a method of producing a wiring board.

BACKGROUND ART

In the field of wiring board production, photosensitive resin compositions are widely used as a resist material for performing an etching treatment or a plating treatment. The photosensitive resin composition is often used as a photosensitive element (laminated body) that is composed of a support film and a layer that is formed on the support film from a photosensitive resin composition (hereinafter, also referred to as a "photosensitive layer").

A wiring board is produced, for example, as follows. First, a photosensitive layer of a photosensitive element is laminated on a conductor layer of a substrate (lamination step). Next, after removing a support film, a prescribed portion of the photosensitive layer is cured by exposing the same to an active light beam (exposure step). Then, the unexposed portion is removed from the substrate (developed) to form a resist pattern composed of a cured product of the photosensitive resin composition on the substrate (development step). By using the obtained resist pattern as a mask, the substrate is subjected to an etching treatment or a plating treatment to form a circuit on the substrate (circuit formation step). Finally, the resist is peeled off, and a wiring board is produced (peeling step).

In the above-described wiring board production method, conventionally, there has been a problem in that defects in processing during the subsequent etching process or plating process may occur due to discoloration of the substrate, which is caused by formation of an oxide film on the conductor layer of the substrate in the development step.

In order to solve this problem of discoloration, techniques such as addition of an aminomethylcarboxybenzotriazole compound having a specific substituent, an aliphatic carboxylic acid such as octanoic acid or isostearic acid, or an aromatic carboxylic acid such as benzoic acid or isophthalic acid, have been examined (see, for example, WO 06/016658 and WO 08/015754).

SUMMARY OF THE INVENTION

Problems to be Solved by the Invention

However, although the photosensitive resin composition disclosed in WO 06/016658 has an excellent effect of inhibiting discoloration of the substrate, there is a problem in that it may cause contamination of a plating bath during the plating step. If a plating bath is contaminated, plating may not be performed at a desired portion during the plating step and a circuit may not be formed in a proper manner. As a result, changing of the plating bath may become more frequent.

The present invention has been made in view of these circumstances, and an object of the present invention is to provide a photosensitive resin composition that can suppress discoloration of a substrate and contamination of a plating bath; a photosensitive element; a method of forming a resist pattern; and a method of producing a wiring board.

Means for Solving the Problems

The present inventors have first conducted various examinations using an aminomethylcarboxybenzotriazole compound having a specific substituent, as disclosed in WO 06/016658. For example, the present inventors have studied to see whether or not discoloration of a substrate and contamination of a plating bath could be reduced by decreasing the amount of the aminomethylcarboxybenzotriazole compound as much as possible so that the amount thereof to be dissolved in a plating bath or the like is as small as possible. However, the present inventors have found that if the content of the aminomethylcarboxybenzotriazole compound is decreased, an effect of suppressing discoloration may not be sufficient. As such, it has been found difficult to attain suppressed discoloration of a substrate and suppressed contamination of a plating bath by using a photosensitive resin composition that includes an aminomethylcarboxybenzotriazole compound having a specific substituent is used, as disclosed in WO 06/016658.

The means for solving the above-described problems are as follows.

<1> A photosensitive resin composition, including: a binder polymer; a photopolymerizable compound having an ethylenically unsaturated group; a photopolymerization initiator; a benzotriazole compound; and an aliphatic diamine compound having from 8 to 30 carbon atoms.

By this, contamination of a plating bath can be further reduced while suppressing discoloration of a substrate at the time of producing a wiring board.

<2> The photosensitive resin composition according to <1>, further including at least one selected from the group consisting of triazole compounds and tetrazole compounds.

By this, the effect of suppressing discoloration of a substrate can be further improved.

<3> A photosensitive element, including: a support; and a photosensitive layer that is formed on the support and is a coating film composed of the photosensitive resin composition according to <1> or <2>.

By using a photosensitive element having the above-described constitution, contamination of a plating bath can be sufficiently reduced while suppressing discoloration of a substrate at the time of producing a wiring board, and a resist pattern can be formed more efficiently.

<4> A method of forming a resist pattern, the method including: a photosensitive layer-forming step of forming a photosensitive layer on a substrate by applying the photosensitive resin composition according to <1> or <2>; an exposure step of exposing at least a portion of the photosensitive layer to an active light beam to form a photo-cured portion in the photosensitive layer; and a development step of removing a portion other than the photo-cured portion.

By using the above-described photosensitive resin composition for forming a photosensitive layer, contamination of a plating bath can be sufficiently reduced while suppressing discoloration of a substrate at the time of producing a wiring board, and a resist pattern can be formed more efficiently.

<5> A method of forming a resist pattern, the method including: a lamination step of laminating the photosensitive element according to <3> on a substrate such that the photosensitive layer faces the substrate; an exposure step of exposing at least a portion of the photosensitive layer to an active light beam to form a photo-cured portion in the photosensitive layer; and a development step of removing a portion other than the photo-cured portion.

The use of the above-described photosensitive element for laminating a photosensitive layer significantly contributes to reduction in production steps or costs by, for example, realizing a roll-to-roll process and shortening the time for a solvent drying process, in addition to the effects achieved by the above-described third embodiment.

<6> A method of producing a wiring board, the method including a step of performing an etching treatment or a plating treatment on a substrate on which a resist pattern is formed by the method of forming a resist pattern according to <4> or <5>.

By this, adverse effects caused by the substrate discoloration, plating bath contamination or the like are suppressed, and a circuit pattern can be formed more efficiently.

<7> The photosensitive resin composition according to <1> or <2>, wherein the aliphatic diamine compound is a compound that contains an alkylene group having from 2 to 4 carbon atoms and a chain aliphatic hydrocarbon group having from 6 to 28 carbon atoms.

<8> The photosensitive resin composition according to any one of <1>, <2> and <7>, wherein the aliphatic diamine compound is a compound represented by following Formula (1):

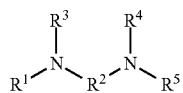
(1)

In Formula (1), $R^1$ represents an aliphatic hydrocarbon group having from 6 to 28 carbon atoms; $R^2$ represents an alkylene group having from 2 to 4 carbon atoms; and each of $R^3$ to $R^5$ independently represents a hydrogen atom, an alkyleneoxy group or a polyalkyleneoxy group.

<9> The photosensitive resin composition according to any one of <1>, <2> and <7>, wherein the aliphatic diamine compound is a compound represented by the following Formula (2):

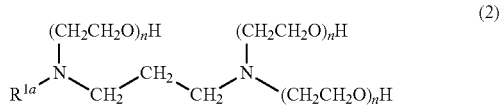
(2)

In Formula (2), $R^{1a}$ represents an aliphatic hydrocarbon group having from 6 to 27 carbon atoms, and each n independently is a number of from 0 to 30 and represents the number of constituent ethyleneoxy units.

<10> The photosensitive resin composition according to any one of <1>, <2> and <7> to <9>, wherein the content of the aliphatic diamine compound is from 0.001 parts by mass to 2 parts by mass in a total of 100 parts by mass of the components except an organic solvent in the photosensitive resin composition.

<11> The photosensitive resin composition according to any one of <1>, <2> and <7> to <10>, wherein the content of the benzotriazole compound is from 0.001 parts by mass to 2 parts by mass in a total of 100 parts by mass of the components except an organic solvent in the photosensitive resin composition.

<12> The photosensitive resin composition according to any one of <1>, <2> and <7> to <11>, wherein the binder polymer has a weight-average molecular weight of from 20,000 to 300,000.

<13> The photosensitive resin composition according to any one of <1>, <2> and <7> to <12>, wherein the photopolymerizable compound contains at least one selected from the group consisting of a compound represented by following Formula (3) and a compound represented by following Formula (4):

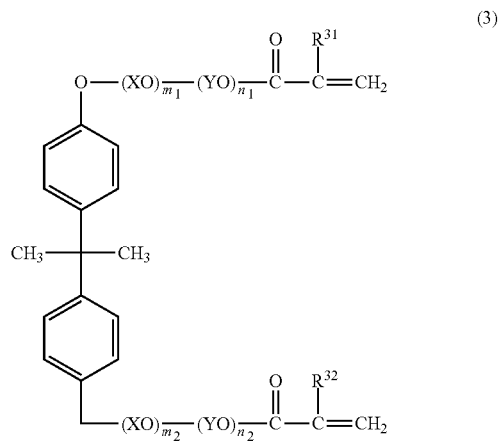
(3)

In Formula (3), each of $R^{31}$ and $R^{32}$ independently represents a hydrogen atom or a methyl group; each of XO and YO independently represents an ethyleneoxy group or a propyleneoxy group; each of $(XO)m_1$, $(XO)m_2$, $(YO)n_1$ and $(YO)n_2$ represents a (poly)ethyleneoxy group or a (poly)propyleneoxy group; and each of $m_1$, $m_2$, $n_1$ and $n_2$ independently represents a number of from 0 to 40. When XO is an ethyleneoxy group and YO is a propyleneoxy group, $m_1+m_2$ is from 1 to 40 and $n_1+n_2$ is from 0 to 20. When XO is a propyleneoxy group and YO is an ethyleneoxy group, $m_1+m_2$ is from 0 to 20 and $n_1+n_2$ is from 1 to 40. Each of $m_1$, $m_2$, $n_1$ and $n_2$ represents the number of the structural units.

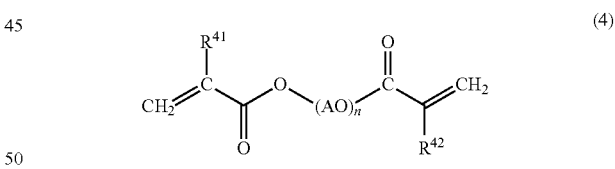
(4)

In a compound represented by Formula (4), AO represents an alkyleneoxy group. The alkyleneoxy group represented by AO is preferably an ethyleneoxy group or a propyleneoxy group, more preferably a propyleneoxy group. When the compound represented by Formula (4) contains more than one AO, the more than one AO may be the same or different from each other.

<14> The photosensitive resin composition according to any one of <1>, <2> and <7> to <10>, wherein the content of the photopolymerization initiator is from 0.05 parts by mass to 10 parts by mass in a total of 100 parts by mass of the components except an organic solvent in the photosensitive resin composition.

<15> Use of the photosensitive resin composition according to any one of <1>, <2> and <7> to <10> in the production of a photosensitive element.

<16> Use of the photosensitive resin composition according to any one of <1>, <2> and <7> to <10> in the formation of a resist pattern.

<17> Use of the photosensitive resin composition according to any one of <1>, <2> and <7> to <10> in the production of a wiring board.

Effect of the Invention

According to the present invention, a photosensitive resin composition that can suppress discoloration of a substrate and contamination of a plating bath; a photosensitive element; a method of forming a resist pattern; and a method of producing a wiring board can be provided.

BRIEF DESCRIPTION OF THE DRAWINGS

FIG. 1 is a schematic cross-sectional view showing an exemplary photosensitive element according to an embodiment of the present invention.

DETAILED DESCRIPTION OF THE INVENTION

Embodiments for Implementing the Invention

In the following, embodiments for implementing the invention are described in detail, but the invention is not restricted to these embodiments. In the present specification, the term "(meth)acrylic acid" means acrylic acid or methacrylic acid, and the term "(meth)acrylate" means an acrylate or a corresponding methacrylate thereof. The term "(meth) acryloyloxy group" means an acryloyloxy group or a methacryloyloxy group, and the term "(poly)alkyleneoxy group" means at least one of an alkyleneoxy group or a polyoxyalkylene group in which two or more alkylene groups are linked via an ether bond. The term "(poly)ethyleneoxy group" means at least one of an ethyleneoxy group or a polyoxyethylene group in which two or more ethylene groups are linked via an ether bond, and the term "(poly)propyleneoxy group" means at least one of a propyleneoxy group or a polypropyleneoxy group in which two or more propylene groups are linked via an ether bond. Further, the term "EO-modified" means that the compound has a (poly)ethyleneoxy group, the term "PO-modified" means that the compound has a (poly)propyleneoxy group, and the term "EO/PO-modified" means that the compound has both a (poly)oxyethylene group and a (poly)oxypropylene group.

In the present specification, the terms "process" encompasses not only an independent process but also a process that cannot be clearly distinguished from other processes, as long as an intended purpose of the process is achieved. A numerical range described as "A to B" includes A and B as the minimum and maximum values, respectively. When there are plural kinds of substances that correspond to the same component of a composition, the amount of the component refers to a total amount of the substances, unless otherwise specified.

<Photosensitive Resin Composition>

The photosensitive resin composition of the present invention contains a binder polymer, a photopolymerizable compound having an ethylenically unsaturated group, a photopolymerization initiator, a benzotriazole compound, and an aliphatic diamine compound having from 8 to 30 carbon atoms (hereinafter, also referred to as a "specific diamine compound").

With this constitution, it becomes possible to further suppress discoloration of a substrate and contamination of a plating bath at the time of producing a wiring board. Although the detailed reason why the effect of the invention can be achieved is not clear, it is thought that the specific diamine compound is less likely to aggregate in the photosensitive resin composition, as compared to a monoamine compound having only one amino group, such as bis(2-ethylhexyl)amine or diisopropanolamine, thereby allowing the benzotriazole compound to disperse in a more uniform manner in the photosensitive resin composition. The benzotriazole compound tends to contaminate a plating bath and the like, when it is used in an amount that is sufficient to suppress discoloration of a substrate. However, by using the specific diamine compound in combination, the benzotriazole compound is dispersed in a more uniform state without aggregating in the photosensitive resin composition. As a result, it becomes possible to further suppress contamination of a plating bath while maintaining favorable effects achieved by the benzotriazole compound, i.e., improving adhesion between a photo-cured portion and a substrate and suppressing discoloration of a substrate.

(Benzotriazole Compound)

In the photosensitive resin composition, the benzotriazole compound functions as an agent that facilitates adhesion between a photo-cured portion and a substrate, an agent that suppresses discoloration of the substrate, an agent that improves plating properties, and the like. The benzotriazole compound is not particularly restricted as long as it is a compound having a benzotriazole skeleton. Examples of the benzotriazole compound include unsubstituted 1H-benzotriazole(1,2,3-benzotriazole) and carboxybenzotriazole having a substituent such as a carboxy group.

The benzotriazole compound is preferably an unsubstituted benzotriazole compound or a carboxyl group-containing benzotriazole compound. The benzotriazole compound may have a substituent other than a carboxy group at its aromatic ring, in such a range that does not impair the effect of the invention. Examples of the substituent other than a carboxy group include a methyl group and an amino group.

The carboxy group-containing benzotriazole compound is preferably at least one of 4-carboxybenzotriazole and 5-carboxybenzotriazole, more preferably at least one of 4-carboxy-1,2,3-benzotriazole and 5-carboxy-1,2,3-benzotriazole. The carboxy group-containing benzotriazole compound may further contain a substituent other than a carboxy group at its aromatic ring in such a range that does not impair the effect of the invention. The carboxy group-containing benzotriazole may have a carboxy group at the 4th position or at the 5th position, or may be a mixture thereof.

The content of the benzotriazole compound in the photosensitive resin composition, in a total of 100 parts by mass of the components except an organic solvent (hereinafter, also referred to as a "nonvolatile content") in the photosensitive resin composition, is preferably from 0.001 parts by mass to 2 parts by mass, more preferably from 0.005 parts by mass to 0.5 parts by mass, still more preferably from 0.01 parts by mass to 0.3 parts by mass. When the content is 0.001 parts by mass or more, a resist, which is a photo-cured product of the photosensitive resin composition, exhibits sufficient adhesion with respect to a conductor layer, and peeling or the like of the resist during a plating treatment or an etching treatment can be suppressed more effectively. In addition, corrosion (rusting) of the conductive layer, which may cause discoloration, can be suppressed more effectively. When the above-described content is 2 parts by mass or less, sensitivity of the photosensitive resin composition tends to be further improved. Also, the amount of energy required for curing can be reduced, and peeling properties of the resist tend to be further improved.

Whether or not the photosensitive resin composition contains a benzotriazole compound can be analyzed by an ordinary analytical method. Specifically, the kind and the amount of the benzotriazole compound in the photosensitive resin composition can be analyzed by way of nuclear magnetic resonance spectrometry, infrared absorption spectrometry, mass spectrometry or the like.

(Diamine Compound)

The photosensitive resin composition includes an aliphatic diamine compound having from 8 to 30 carbon atoms (specific diamine compound) in addition to the benzotriazole compound. As a result, the photosensitive resin composition can suppress discoloration of a substrate and contamination of a plating bath, more effectively. The specific diamine compound is a compound in which an aliphatic group is bound to two nitrogen atoms. This aliphatic group contains a monovalent group that is bound to one nitrogen atom and a divalent group that is bound to two nitrogen atoms. The carbon atoms in the number of from 8 to 30 refers to carbon atoms that exist in the aliphatic hydrocarbon group among the aliphatic groups. When the specific diamine compound contains two or more aliphatic hydrocarbon groups, the number of the carbon atoms refers to the total number of the carbon atoms in all of the aliphatic hydrocarbon groups. The aliphatic hydrocarbon group may be a chain aliphatic hydrocarbon group or a cyclic aliphatic hydrocarbon group. Also, the aliphatic hydrocarbon group may be a saturated aliphatic hydrocarbon group or an unsaturated aliphatic hydrocarbon group. Among these, from the standpoint of dispersibility in the photosensitive resin composition, the aliphatic hydrocarbon group is preferably a chain aliphatic hydrocarbon group.

The number of the aliphatic hydrocarbon group in the specific diamine compound is not particularly restricted, and it may be one or two or more. The number of the aliphatic hydrocarbon group is preferably from 2 to 5, more preferably from 2 to 3, still more preferably 2.

The number of carbon atoms in the specific diamine compound is from 8 to 30. From the standpoint of dispersing the benzotriazole compound in the photosensitive resin composition more uniformly, it is preferably from 10 to 30, more preferably from 12 to 25, still more preferably from 15 to 25, particularly preferably from 17 to 21.

From the standpoint of dispersibility of the specific diamine compound in the photosensitive resin composition, the specific diamine compound is preferably a diamine compound including an alkylene group having from 2 to 4 carbon atoms and a chain aliphatic hydrocarbon group having from 6 to 28 carbon atoms, more preferably a diamine compound including an alkylene group having from 2 to 3 carbon atoms and a chain aliphatic hydrocarbon group having from 12 to 25 carbon atoms, still more preferably a diamine compound including an alkylene group having 3 carbon atoms and a chain aliphatic hydrocarbon group having from 12 to 18 carbon atoms.

Examples of the specific diamine compound include diamine compounds having one aliphatic hydrocarbon group, such as octanediamine, decanediamine and dodecanediamine; and diamine compounds having two aliphatic hydrocarbon groups, such as dodecylpropylenediamine, tetradecylpropylenediamine, hexadecylpropylenediamine, octadecylpropylenediamine, oleylpropylenediamine, eicosylpropylenediamine, docosylpropylenediamine, dodecylethylenediamine, tetradecylethylenediamine, hexadecylethylenediamine, octadecylethylenediamine, oleylethylenediamine, eicosylethylenediamine, docosylethylenediamine, dodecylethylenediamine, tetradecylethylenediamine, hexadecylethylenediamine, octadecylethylenediamine, eicosylethylenediamine and docosylethylenediamine. These diamine compounds may be used singly, or in combination of two or more thereof.

Among these specific diamine compounds, from the standpoint of further suppressing contamination of a plating bath, it is preferred to use at least one selected from the group consisting of dodecylpropylenediamine, tetradecylpropylenediamine, hexadecylpropylenediamine, octadecylpropylenediamine, oleylpropylenediamine, dodecylethylenediamine, tetradecylethylenediamine, hexadecylethylenediamine, octadecylethylenediamine and oleylethylenediamine. It is more preferred to use at least one selected from the group consisting of dodecylpropylenediamine, tetradecylpropylenediamine, hexadecylpropylenediamine, octadecylpropylenediamine and oleylpropylenediamine.

From the standpoint of suppressing discoloration of a substrate and contamination of a plating bath more effectively, the specific diamine compound is preferably a diamine compound including an alkylene group having from 2 to 4 carbon atoms and an aliphatic hydrocarbon group having from 6 to 28 carbon atoms, more preferably a compound represented by following Formula (1), still more preferably a compound represented by following Formula (2).

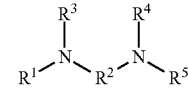

(1)

In Formula (1), $R^1$ represents an aliphatic hydrocarbon group having from 6 to 28 carbon atoms; $R^2$ represents an alkylene group having from 2 to 4 carbon atoms; and each of $R^3$ to $R^5$ independently represents a hydrogen atom, an alkyleneoxy group or a polyalkyleneoxy group. The number of carbon atoms of $R^1$ is preferably from 12 to 25, more preferably from 12 to 18. The number of carbon atoms of $R^2$ is preferably from 2 to 4, more preferably 2 to 3. In the alkyleneoxy group represented by $R^3$ to $R^5$, the number of carbon atoms is preferably from 2 to 4, more preferably 2 to 3. Further, the number of structural units of the polyalkyleneoxy group in $R^3$ to $R^5$ is preferably from 1 to 30, more preferably from 1 to 25, still more preferably from 1 to 20. Here, the number of structural units of the polyalkyleneoxy group is an integer in a case of a single molecule, or a rational number representing an average value in the case of an aggregate of plural kinds of molecules. Hereinafter, the same definition is applied to the number of other structural units.

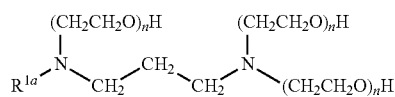

(2)

In Formula (2), $R^{1a}$ represents an aliphatic hydrocarbon group having from 6 to 27 carbon atoms, and each of n is independently a number of from 0 to 30, which represents the number of ethyleneoxy units. In Formula (2), $R^{1a}$ is preferably an aliphatic hydrocarbon group having from 12 to 25 carbon atoms, more preferably an aliphatic hydrocarbon group having from 12 to 18 carbon atoms. Further, n is preferably from 0 to 25, more preferably from 0 to 20.

As the compounds represented by Formula (1), beef tallow alkyl-propylene diamine, hardened beef tallow alkyl-propylene diamine and oleylpropylene diamine are commercially available as NISSAN AMINE $^R$DT, NISSAN AMINE $^R$DT-H and NISSAN AMINE $^R$DOB-R (all of which are manufactured by NOF Corporation), respectively.

In addition, as the compounds represented by Formula (1), hardened beef tallow propylene diamine and beef tallow propylene diamine are commercially available as DIAMINE R-86 and DIAMINE RRT (both of which are manufactured by Kao Corporation), respectively. These products may be used singly, or in a combination of two or more thereof.

Among the compounds represented by Formula (1), N,N', N'-tris(2-hydroxyethyl)-N-alkyl(beef tallow)-1,3-diaminopropane is commercially available as ETHODUMEEN T/13 (manufactured by Lion Corporation, trade name), and N,N', N'-polyoxyethylene-N-alkyl(beef tallow)-1,3-diaminopropane is commercially available as ETHODUMEEN T/25 (manufactured by Lion Corporation, trade name), respectively.

The content of the specific diamine compound in the photosensitive resin composition, in a total of 100 parts by mass of the components except an organic solvent (nonvolatile content) in the photosensitive resin composition, is preferably from 0.001 parts by mass to 2 parts by mass, more preferably from 0.001 parts by mass to 0.5 parts by mass, still more preferably from 0.001 parts by mass to 0.1 parts by mass. When the content is 0.001 parts by mass or more, a resist formed from the photosensitive resin composition exhibits a sufficient adhesion with respect to a conductor layer, and peeling or the like of the resist during a plating treatment or an etching treatment can be suppressed more effectively. In addition, corrosion (rusting) of the conductive layer that causes discoloration may be suppressed more effectively. When the above-described content is 2 parts by mass or less, sensitivity of the photosensitive resin composition tends to be further improved. Also, the amount of energy required for curing can be reduced, and peeling properties of the resist also tends to be further improved.

The content ratio of the specific diamine compound with respect to the benzotriazole compound (specific diamine compound/benzotriazole compound) in terms of mass is preferably from 0.1 to 10, more preferably from 0.5 to 5.0. When the content ratio is 0.1 or higher, solubility of the benzotriazole compound tends to be better. When the content ratio is 10 or lower, the photosensitive resin composition tends to have a better sensitivity and a better adhesion.

Whether or not the photosensitive resin composition contains a specific diamine compound can be analyzed by an ordinary analytical method. Specifically, the type and the amount of the specific diamine compound contained in the photosensitive resin composition can be analyzed by way of nuclear magnetic resonance spectrometry, infrared absorption spectrometry, mass spectometry or the like.

(Binder Polymer)

The photosensitive resin composition contains a binder polymer. The binder polymer mainly has a function of imparting film-forming properties to the photosensitive resin composition. Any binder polymer can be used with no particular restriction, as long as it functions in this way. Specific examples of the binder polymer include acrylic resins, styrene resins, epoxy resins, amide resins, amide epoxy resins, alkyd resins and phenol resins. These binder polymers may be used singly, or in combination of two or more thereof. Among these, resins that can be developed with an aqueous alkali solution are preferred, and an acrylic resin is preferred from this point of view.

These binder polymers can be obtained by, for example, radical polymerization of a polymerizable monomer. Examples of the polymerizable monomer include styrene; polymerizable styrene derivatives such as vinyl toluene, α-methylstyrene, p-methylstyrene and p-ethylstyrene; acrylamides; acrylonitriles; vinyl alcohol esters such as vinyl-n-butyl ether; (meth)acrylic acid esters; (meth)acrylic acid; (meth)acrylic acid derivatives such as α-bromo(meth)acrylic acid, α-chloro(meth)acrylic acid, β-furyl (meth)acrylic acid and β-styryl (meth)acrylic acid; maleic acid; maleic anhydride; maleic acid monoesters such as monomethyl maleate, monoethyl maleate and monoisopropyl maleate; fumaric acid; cinnamic acid; α-cyanocinnamic acid; itaconic acid; crotonic acid; and propiolic acid. These polymerizable monomers may be used singly, or in combination of two or more thereof.

From the standpoint of alkali developability, the binder polymer preferably has a carboxy group. A carboxyl group-containing binder polymer can be obtained by, for example, radical polymerization of a carboxy group-containing polymerizable monomer and a different polymerizable monomer. The carboxy group-containing polymerizable monomer is preferably (meth)acrylic acid. From the standpoint of flexibility, the binder polymer is preferably a copolymer obtained by using styrene or a styrene derivative as a polymerizable monomer. From these standpoints, the binder polymer is particularly preferably a copolymer that is obtained by copolymerizing a polymerizable monomer composition that includes (meth)acrylic acid, a (meth)acrylic acid ester, and styrene or a styrene derivative.

Examples of the (meth)acrylic acid ester include alkyl (meth)acrylates, tetrahydrofurfuryl (meth)acrylate, dimethylaminoethyl (meth)acrylate, diethylaminoethyl (meth)acrylate, glycidyl (meth)acrylate, benzyl (meth)acrylate, 2,2,2-trifluoroethyl (meth)acrylate, 2,2,3,3-tetrafluoropropyl (meth)acrylate, lauryl (meth)acrylate and 2-hydroxypropyl (meth)acrylate.

Further, examples of the alkyl (meth)acrylates include methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, 2-ethylhexyl (meth)acrylate, and their structural isomers. These alkyl (meth)acrylates may be used singly, or in combination of two or more thereof.

In a case in which (meth)acrylic acid is used as a component to be copolymerized, from the standpoints of alkali developability and adhesion, the content of (meth)acrylic acid is preferably from 5% by mass to 50% by mass, more preferably from 5% by mass to 45% by mass, still more preferably from 10% by mass to 45% by mass, particularly preferably from 15% by mass to 45% by mass, extremely preferably from 15% by mass to 40% by mass.

In a case in which styrene or a styrene derivative is used as a component to be copolymerized, from the standpoints of adhesion and peeling property, the content of the styrene or styrene derivative is preferably from 3% by mass to 30% by mass, more preferably from 4% by mass to 28% by mass, still more preferably from 5% by mass to 27% by mass. When the content is 3% by mass or more, adhesion tends to be higher. When the content is 30% by mass or less, an increase in the size of peeled pieces is suppressed, and the peeling time tends to be reduced.

The weight-average molecular weight of the binder polymer is not particularly restricted. It is preferably from 20,000 to 300,000, more preferably from 20,000 to 200,000, still more preferably from 30,000 to 150,000, particularly preferably from 40,000 to 120,000, extremely preferably from 60,000 to 120,000. When the weight-average molecular weight is 20,000 or greater, resistance to a developer tends to be further improved. When the weight-average molecular weight is 300,000 or less, the developing time tends to be reduced. The weight-average molecular weight of the binder polymer is measured by gel permeation chromatography (GPC) and calculated based on a calibration curve prepared using standard polystyrene. The GPC measurement conditions are described in the Examples.

The binder polymer may be used singly, or in combination of two or more thereof. In a case in which two or more binder polymers are used in combination, examples of the combination include two or more kinds of binder polymers that are composed of different copolymerization components; two or more kinds of binder polymers having different weight-average molecular weights; and two or more kinds of binder polymers having different degrees of dispersion. It is also possible to use a polymer described in Japanese Patent Application Laid-Open (JP-A) No. H11-327137, which has a multi-mode molecular weight distribution.

The content of the binder polymer in the photosensitive resin composition, in a total of 100 parts by mass of the components except an organic solvent (nonvolatile content) in the photosensitive resin composition, is preferably from 20 parts by mass to 80 parts by mass, more preferably from 40 parts by mass to 70 parts by mass. When the content of the binder polymer is 20 parts by mass or more, the resulting resist tends to become tougher and have an improved durability against a plating treatment, an etching treatment or the like. When the content of the binder polymer is 80 parts by mass or less, sensitivity of the photosensitive resin composition tends to be further improved.

(Photopolymerizable Compound Having Ethylenically Unsaturated Group)

The photosensitive resin composition contains a photopolymerizable compound having an ethylenically unsaturated bond (hereinafter, also referred to as a "photopolymerizable compound"). The photopolymerizable compound is a component that polymerizes to cure the photosensitive resin composition when irradiated with an active light beam. The photopolymerizable compound is a monomer or a copolymer that has a functional group that can be crosslinked by the action of at least one of light or a photopolymerization initiator, as described above, and it is a compound having a polymerizable ethylenically unsaturated group in its molecule. The structure of the photopolymerizable compound is not particularly restricted, and may have any of an aliphatic structure, an aromatic structure, an alicyclic or heterocyclic structure, or the like. The photopolymerizable compound may have an ester bond, a urethane bond, an amide bond or the like in its molecule. The ethylenically unsaturated group is preferably a (meth)acryloyl group.

Examples of the photopolymerizable compound include compounds obtained by a reaction between a polyhydric alcohol and an α,β-unsaturated carboxylic acid; bisphenol A-based (meth)acrylate compounds, such as bisphenol A-based di(meth)acrylate compounds and hydrogenated bisphenol A-based di(meth)acrylate compounds; compounds obtained by a reaction between a glycidyl group-containing compound and an 4-unsaturated carboxylic acid; urethane monomers, such as (meth)acrylate compounds having an urethane bond in the molecule; nonylphenoxypolyethyleneoxy acrylates; phthalic acid-based compounds; alkyl (meth)acrylates; polyalkylene glycol (meth)acrylate compounds; and trimethylolpropane (meth)acrylate compounds. These photopolymerizable compounds may be used singly, or in combination of two or more thereof.

Among these photopolymerizable compounds, the photosensitive resin composition preferably contains at least one photopolymerizable compound selected from bisphenol A-based di(meth)acrylate compounds, hydrogenated bisphenol A-based di(meth)acrylate compounds, di(meth)acrylate compounds having an urethane bond in the molecule, polyalkylene glycol di(meth)acrylate or trimethylolpropane di(meth)acrylate.

Examples of the bisphenol A-based di(meth)acrylate compounds include a compound represented by following Formula (3).

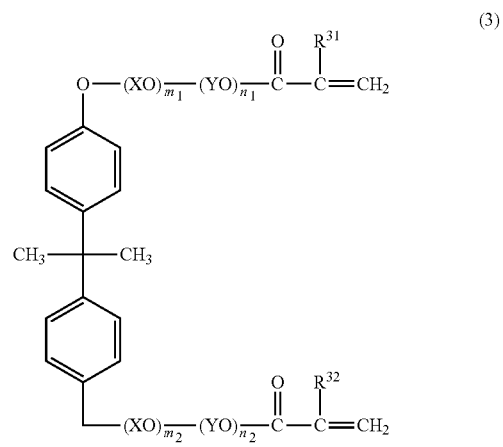

In Formula (3), each of $R^{31}$ and $R^{32}$ independently represents a hydrogen atom or a methyl group; each of XO and YO independently represents an ethyleneoxy group or a propyleneoxy group; each of $(XO)m_1$, $(XO)m_2$, $(YO)n_1$ and $(YO)n_2$ represents a (poly)ethyleneoxy group or a (poly)propyleneoxy group; and each of $m_1$, $m_2$, $n_1$ and $n_2$ independently represents a number from 0 to 40. When XO is an ethyleneoxy group and YO is a propyleneoxy group, $m_1+m_2$ is from 1 to 40, and $n_1+n_2$ is from 0 to 20. When XO is a propyleneoxy group and YO is an ethyleneoxy group, $m_1+m_2$ is from 0 to 20, and $n_1+n_2$ is from 1 to 40. Each of $m_1$, $m_2$, $n_1$ and $n_2$ represents the number of structural units, respectively.

Among the compounds represented by Formula (3), 2,2-bis(4-(methacryloxypentaethoxy)phenyl)propane is commercially available as BPE-500 (manufactured by Shin-Nakamura Chemical Co., Ltd., trade name) and FA-321M (manufactured by Hitachi Chemical Co., Ltd., trade name), and 2,2-bis(4-(methacryloxypentadecaethoxy)phenyl)propane is commercially available as BPE-1300 (manufactured by Shin-Nakamura Chemical Co., Ltd., trade name). These compounds may be used singly, or in a combination of two or more thereof.

In a case in which the photosensitive resin composition contains a bisphenol A-based di(meth)acrylate compound as the photopolymerizable compound, the content thereof, in a total of 100 parts by mass of the components except an organic solvent (nonvolatile content) in the photosensitive resin composition, is preferably from 10 parts by mass to 50 parts by mass, more preferably from 15 parts by mass to 40 parts by mass.

From the standpoint of improving flexibility of a cured product (cured film) of the photosensitive resin composition, it is preferred that the photopolymerizable compound contains at least one polyalkylene glycol di(meth)acrylate as other photopolymerizable compound. The number of constituent oxyalkylene units in the polyalkylene glycol di(meth)acrylate is not particularly restricted, but it is preferably from 3 to 15, more preferably from 4 to 14.

Examples of the (poly)oxyalkylene group in the polyalkylene glycol di(meth)acrylate include a (poly)oxyethylene group and a (poly)oxypropylene group. The polyalkylene glycol di(meth)acrylate may contain either one or both of these groups, and the polyalkylene glycol di(meth)acrylate preferably contains at least a (poly)oxypropylene group. It is more preferred that the polyalkylene glycol di(meth)acrylate contains only a (poly)oxypropylene group as a (poly)oxyalkylene group. It is still more preferred that the polyalkylene glycol di(meth)acrylate is a polypropylene glycol di(meth)acrylate containing from 4 to 15 constituent oxypropylene units.

In a case in which the photopolymerizable compound contains a polyalkylene glycol di(meth)acrylate, the content thereof, for example, in a total of 100 parts by mass of the components except an organic solvent (nonvolatile content) in the photosensitive resin composition, is preferably from 5 parts by mass to 30 parts by mass, more preferably from 5 parts by mass to 25 parts by mass.

From the standpoint of improving flexibility of a cured product (cured film) of the photosensitive resin composition, the polyalkylene glycol di(meth)acrylate is preferably a compound represented by following Formula (4).

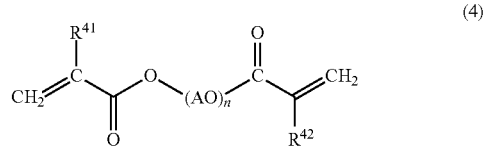

(4)

In the compound represented by Formula (4), AO represents an alkyleneoxy group. The alkyleneoxy group represented by AO is preferably an ethyleneoxy group or a propyleneoxy group, more preferably a propyleneoxy group. When the compound represented by Formula (4) contains more than one AO, the more than one AO may be the same or different from each other. Further, when the compound represented by Formula (4) contains more than one of different kinds of AO, each of AO is preferably independently an ethyleneoxy group or a propyleneoxy group. Moreover, when the compound represented by Formula (4) contains an ethyleneoxy group and a propyleneoxy group as more than one of different kinds of AO, these groups may be in the form of a block copolymer or a random copolymer.

Each of $R^{41}$ and $R^{42}$ independently represents a hydrogen atom or a methyl group. From the standpoint of improving resistance with respect to a developer, $R^{41}$ and $R^{42}$ are preferably hydrogen atoms. Further, in the compound represented by Formula (4), n represents the number of constituent alkyleneoxy units and is from 0 to 50. Accordingly, n is an integer in the case of a single molecule, or a rational number representing an average value in the case of an aggregate of plural kinds of molecules. Hereinafter, the same definition is applied to the number of other structural units.

From the standpoint of further improving tent reliability, n is preferably from 4 to 25, more preferably from 6 to 24, still more preferably from 6 to 14, particularly preferably from 6 to 10.

Examples of the compound represented by Formula (4) include di(meth)acrylic anhydride (n=0), (poly)ethylene glycol di(meth)acrylate (n=1 to 50), (poly)propylene glycol di(meth)acrylate (n=1 to 50), and (poly)ethylene glycol-(poly)propylene glycol di(meth)acrylate (n=1 to 50). Among these, from the standpoints of adhesion and resolution, the compound represented by Formula (4) is preferably at least one selected from the group consisting of (poly)ethylene glycol di(meth)acrylate (n=1 to 50) and (poly)propylene glycol di(meth)acrylate (n=1 to 50), more preferably (poly)propylene glycol di(meth)acrylate (n=1 to 50).

The (poly)alkylene glycol di(meth)acrylate can be obtained by, for example, allowing (poly)alkylene glycol to react with (meth)acrylic acid. Examples of the compounds represented by Formula (4) that are commercially available include polyethylene glycol dimethacrylate, such as 9G, 14G and 23G (all of which are manufactured by Shin-Nakamura Chemical Co., Ltd., trade names); polyethylene glycol diacrylate, such as A-200, A-400, A-600 and A-1000 (all of which are manufactured by Shin-Nakamura Chemical Co., Ltd., trade names); polypropylene glycol diacrylate, such as APG100, APG200, APG400 and APG700 (all of which are manufactured by Shin-Nakamura Chemical Co., Ltd., trade names); and polypropylene glycol dimethacrylate such as 9PG (manufactured by Shin-Nakamura Chemical Co., Ltd., trade name).

From the standpoint of satisfying photosensitive characteristics such as resolution, adhesion and peeling property, as well as the properties with respect to a substrate such as prevention of discoloration or reduction in contamination of a plating bath, the photopolymerizable compound preferably contains at least one selected from the group consisting of a compound represented by Formula (3) and a compound represented by Formula (4), more preferably contains both a compound represented by Formula (3) and a compound represented by Formula (4).

The content of the photopolymerizable compound in the photosensitive resin composition, in a total of 100 parts by mass of the components except an organic solvent (nonvolatile content) in the photosensitive resin composition, is preferably from 30 parts by mass to 70 parts by mass, more preferably from 35 parts by mass to 65 parts by mass, still more preferably from 35 parts by mass to 50 parts by mass. When the content is 30 parts by mass or more, sufficient sensitivity and resolution tend to be easily attained. When the content is 70 parts by mass or less, it tends to be easier to form a film (such as a photosensitive resin composition layer or a photosensitive layer) and to obtain a favorable resist shape.

(Photopolymerization Initiator)

The photosensitive resin composition contains at least one photopolymerization initiator. The photopolymerization initiator is a component that is capable of initiating polymerization of the above-described photopolymerizable compound and the like, upon exposure to an active light beam. As a photopolymerization initiator, a known compound that is conventionally used as a photoinitiator can be employed.

Specific examples of the photopolymerization initiator include aromatic ketones such as benzophenone, 4-methylbenzophenone, N,N,N',N'-tetramethyl-4,4'-diaminobenzophenone (Michler's ketone), N,N,N',N'-tetraethyl-4,4'-diaminobenzophenone (EAB), 4-methoxy-4'-dimethylaminobenzophenone and 2-benzyl-2-dimethylamino-1-(4-morpholinophenyl)-butanone-1,2-methyl-1-[4-(methylthio)phenyl]-2-morpholino-propanone-1; benzyl derivatives such as benzyl dimethyl ketal; 2,4,5-triarylimidazole dimers such as 2,2'-bis(o-chlorophenyl)-4,5,4',5'-tetraphenyl-1,2'-biimidazole, 2-(o-chlorophenyl)-4,5- diphenylimidazole dimer (B-CIM), 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer; acridine derivatives such as 9-phenylacridine and 1,7-bis(9,9'-acridinyl)heptane; N-phenylglycine and N-phenylglycine derivatives; coumarin-based compounds; and thioxanthone compounds. These compounds may be used singly, or in a combination of two or more thereof.

From the standpoint of improving sensitivity and adhesion, the photopolymerization initiator preferably contains at least one selected from the group consisting of 2,4,5-triarylimidazole dimers and aromatic ketones, more preferably contains a 2,4,5-triarylimidazole dimer such as 2-(o-chlorophenyl)-4,5-diphenylimidazole dimer. The structure of the 2,4,5-triarylimidazole dimer may be symmetrical or asymmetrical.

The content of the photopolymerization initiator, in a total of 100 parts by mass of the components except an organic solvent (nonvolatile content) in the photosensitive resin composition, is preferably from 0.05 parts by mass to 10 parts by mass, more preferably from 0.1 parts by mass to 6 parts by mass, still more preferably from 0.3 parts by mass to 4 parts by mass. When the content of the photopolymerization initiator is 0.05 parts by mass or more, curing of the photosensitive resin composition tends to sufficiently progress, and a more favorable resist can tends to be obtained. When the content is 10 parts by mass or less, deposition of the photopolymerization initiator from the photosensitive resin composition can be suppressed, and resolution can be further improved.

(Organic Solvent)

If necessary, the photosensitive resin composition may contain at least one kind of organic solvent. Examples of the organic solvent include alcohol solvents such as methanol, ethanol and isopropyl alcohol; ketone solvents such as acetone and methyl ethyl ketone; glycol ether solvents such as methyl cellosolve, ethyl cellosolve, methylene glycol monomethyl ether and propylene glycol monomethyl ether; aromatic hydrocarbon solvents such as toluene; aprotic polar solvents such as N,N-dimethylformamide; halogen-containing solvents such as methylene chloride; and monoamine solvents such as bis(2-ethylhexyl)amine and diisopropanolamine. The organic solvent may be used singly, or in combination of two or more thereof. When the photosensitive resin composition contains an organic solvent, the content thereof is preferably from 40% by mass to 70% by mass with respect to the total mass of the photosensitive resin composition, for example.

(Triazole Compound, Tetrazole Compound and the like)

The photosensitive resin composition preferably further contains at least one selected from the group consisting of triazole compounds and tetrazole compounds (hereinafter, also referred to as a "specific nitrogen-containing compound"). By including a specific nitrogen-containing compound, discoloration of a substrate can be more effectively suppressed. Examples of the triazole compounds and tetrazole compounds include 3-aminotriazole and 5-aminotetrazole. Among these, the photosensitive resin composition preferably contains at least one selected from the group consisting of amino group-containing triazole compounds and amino group-containing tetrazole compound, more preferably at least one selected from the group consisting of 3-aminotriazole and 5-aminotetrazole.

In a case in which the photosensitive resin composition further contains a specific nitrogen-containing compound, the content thereof, in a total of 100 parts by mass of the components except an organic solvent (nonvolatile content) in the photosensitive resin composition, is preferably from 0.001 parts by mass to 1 part by mass, more preferably from 0.001 parts by mass to 0.1 parts by mass, still more preferably from 0.001 parts by mass to 0.05 parts by mass.

If necessary, the photosensitive resin composition may further contain a monoamine compound, in addition to the specific diamine compound. Examples of the monoamine compound include secondary amine compounds such as bis(2-ethylhexyl)amine and diisopropanolamine.

In a case in which the photosensitive resin composition further contains a monoamine compound, the content thereof, in a total of 100 parts by mass of the components except an organic solvent (nonvolatile content) that are contained in the photosensitive resin composition, is preferably from 0.001 parts by mass to 2 parts by mass, more preferably from 0.001 parts by mass to 0.5 parts by mass.

(Other Components)

In addition to the above-described binder polymer, photopolymerizable compound, photopolymerization initiator, benzotriazole compound and specific diamine compound, the photosensitive resin composition may further contain other components.

Examples of other components include organic halides. Examples thereof include pentabromoethane, tribromoacetophenone, bis(tribromomethyl)sulfone and tribromomethylphenylsulfone. Addition of an organic halide tends to further improve the sensitivity of the photosensitive resin composition.

Further, if necessary, the photosensitive resin composition may also contain, for example, a dye such as malachite green; a photochromic agent such as tribromomethylphenylsulfone or leuco crystal violet; a thermal coloration inhibitor; a plasticizer such as p-toluenesulfonamide; a pigment; a filler; a defoaming agent; a flame retardant; a stabilizer; an adhesion-imparting agent; a leveling agent; a peeling accelerator; an antioxidant; a flavoring agent; an imaging agent; and a thermal crosslinking agent.

In a case in which the photosensitive resin composition contains other components, the content of each component may be from about 0.01 parts by mass to about 20 parts by mass, with respect to a total of 100 parts by mass of the above-described binder polymer, photopolymerizable compound, photopolymerization initiator, benzotriazole compound and specific diamine compound. These other components may be used singly, or in combination of two or more thereof.

If necessary, the photosensitive resin composition may further contain a filler. Examples of the filler include inorganic particles such as particles of silica, molten silica, talc, alumina, hydrated alumina, barium sulfate, aluminum hydroxide, magnesium hydroxide, calcium hydroxide, aerogel and calcium carbonate; organic particles such as powdered epoxy resin and powdered polyimide particles; and powdered TEFLON (registered trademark) particles. These fillers may be subjected to a coupling treatment in advance. These fillers can be kneaded with a known apparatus such as a kneader, a ball mill, a bead mill or a three-roll mill, and dispersed in the photosensitive resin composition.

In a case in which the photosensitive resin composition contains a filler, the content thereof is not particularly restricted as long as it is within the range that does not cause reduction in resolution and flame retardancy. The content of the filler can be, for example, from about 2% by mass to about 20% by mass, preferably from about 5% by mass to about 15% by mass, with respect to the total mass of the nonvolatile content of the photosensitive resin composition.

(Photosensitive Element)

The photosensitive element of the present invention includes: a support; and a photosensitive layer that is formed on the support and is a coating film of the photosensitive resin composition, as described above.

A photosensitive element according to a preferred embodiment will be described. FIG. 1 is a schematic cross-sectional view showing one exemplary photosensitive element according to an embodiment. In FIG. 1, a photosensitive film 1 includes: a support 11; a photosensitive layer 12 that is formed on the support 11 and is a coating film of the photosensitive resin composition; and a protection film 13 that is disposed on the photosensitive layer 12. In this example, the photosensitive layer 12 is composed of the photosensitive resin composition that is not cured.

The support 11 is, for example, a polymer film having heat resistance and solvent resistance, such as a film composed of polyethylene terephthalate, polypropylene, polyethylene, polyester or the like. In the photosensitive film 1, the thickness of the support 11 is not particularly restricted. For example, the thickness of the support 11 is preferably from 5 μm to 150 μm, more preferably from 5 μm to 50 μm, still more preferably from 8 μm to 30 μm, particularly preferably from 10 μm to 20 μm. When the thickness is 5 μm or more, breakage of the support 11 tends to be more suppressed upon removal of the support 11 prior to the development. When the thickness is 150 μm or less, resolution of the photosensitive layer 12 tends to be further improved. The thickness of the support 11 in the photosensitive element 1 refers to an arithmetic mean thickness that is measured with a dial gauge (number of measurement points: 3) or with a n-ray thickness gauge (number of measurement points: 10), and this applies to the thickness of the photosensitive layer 12 and the thickness of the protection film 13.

The haze of the support 11 is not particularly restricted. For example, the haze of the support 11 is preferably from 0.001 to 5.0, more preferably from 0.001 to 2.0, still more preferably from 0.01 to 1.8. When the haze value is 2.0 or less, resolution of the photosensitive layer 12 tends to be further improved. The haze can be measured in accordance with JIS K7375 (2008) using, for example, a commercially available turbidimeter such as NDH-1001DP (manufactured by Nippon Denshoku Industries Co., Ltd., trade name).

The photosensitive layer 12 is a coating film formed from the photosensitive resin composition of the above-described embodiment, and its thickness is not particularly restricted. For example, the thickness of the photosensitive layer 12 is preferably from 1 μM to 150 μm, more preferably from 5 μm to 100 μm, still more preferably from 10 μm to 50 μm. When the thickness of the photosensitive layer 12 is 1 μm or more, industrial coating process tends to become easier to perform, thereby improving productivity. When the thickness of the resin layer 12 is 150 μm or less, its adhesion and resolution tend to be further improved.

As a method of forming the photosensitive layer 12 on the support 11, for example, a method in which the photosensitive resin composition is mixed with a solvent and the like to prepare a solution or a varnish and, after applying this solution or the like onto the support 11, the solvent and the like are removed, can be employed. Examples of the solvent to be mixed with the photosensitive resin composition include alcohol solvents such as methanol, ethanol and isopropyl alcohol; ketone solvents such as acetone and methyl ethyl ketone; glycol ether solvents such as methyl cellosolve, ethyl cellosolve, methylene glycol monomethyl ether and propylene glycol monomethyl ether; aromatic hydrocarbon solvents such as toluene; aprotic polar solvents such as N,N-dimethylformamide; and halogen-containing solvents such as methylene chloride. These solvents may be used singly or in combination of two or more thereof. The nonvolatile content in the solution or the varnish is preferably adjusted to from about 30% by mass to about 60% by mass.

Examples of a method of applying the solution or the varnish onto the support 11 include a method utilizing a known apparatus such as a roll coater, a comma coater, a gravure coater, an air-knife coater, a die coater or a bar coater. Removal of the solvent or the like can be performed by, for example, heating the support applied with the solution at from 70° C. to 150° C. for from about 5 minutes to about 30 minutes. After the removal of the solvent, from the standpoint of suppressing diffusion of the solvent in the subsequent steps, the amount of the solvent that remains in the photosensitive layer 12 is preferably 2% by mass or less.

The protection film 13 is, for example, a polymer film having heat resistance and solvent resistance, such as a film composed of polyethylene terephthalate, polypropylene, polyethylene, polyester or the like. From the standpoint of performing removal of the protection film 13 more easily upon formation of a photosensitive layer on a wiring board using the photosensitive element 1 as described below, the protection film 13 preferably has a smaller adhesion with respect to the photosensitive layer 12 than that of the support 11. As such, the protection film 13 is preferably a polyolefin film such as a polyethylene film or a polypropylene film.

The thickness of the protection film 13 is not particularly restricted. For example, the thickness of the protection film 13 is preferably from 5 μm to 30 μm, more preferably from 10 μm to 28 μm, still more preferably from 15 μm to 25 μm. When the thickness is 5 μm or more, breakage of the protection film 13 tends to be suppressed when laminating the photosensitive element 1 on a copper-clad laminate or the like. When the thickness is 30 μm or less, an increase in the production cost of the photosensitive element 1 tends to be suppressed.

Examples of the method of laminating the protection film 13 on the photosensitive layer 12 include a method in which a solution or the like containing the photosensitive resin composition is applied on the support 11 and dried to form a coating film, and the protection film 13 is laminated on the dried photosensitive layer 12, then heat-pressing is performed to the resulting laminate.

The photosensitive element 1 having a constitution as described above can be stored in the form of a sheet or a roll in which the photosensitive element 1 is wound around a roll core or the like. In a case in which the photosensitive element 1 is stored in the form of a roll, from the standpoint of protecting its edge surfaces, it is preferred to provide an edge separator at the edge surfaces of the roll, and from the standpoint of suppressing edge fusion, it is more preferred to provide a moisture-proof edge separator thereon. In a case in which a roll is packaged, it is preferably wrapped with a black sheet having a low moisture permeability.

In a preferred embodiment, the photosensitive element 1 has a constitution as described above. The photosensitive element 1 may further include, for example, an interlayer such as a cushion layer, an adhesive layer, a light-absorbing layer or a gas barrier layer, or a protection layer, in addition to the support 11, the photosensitive layer 12 and the protection film 13. The photosensitive element 1 may have a two-layer structure of the support 11 and the photosensitive layer 12, without having the protection film 13.

(Method of Forming Resist Pattern)

A method of forming a resist pattern using the photosensitive resin composition or the photosensitive element will be described. A resist pattern can be suitably formed by, for example, a method that includes: a step of forming, on a substrate, a photosensitive layer that is a coating film composed of the photosensitive resin composition; a step of forming a photo-cured part on the photosensitive layer by exposing at least a portion of the photosensitive layer with an active light beam; and a step of performing development to remove a portion other than the photo-cured part of the photosensitive layer.

In this formation method, it is preferred to first prepare a substrate on which a resist pattern is to be formed. The substrate may be, for example, an insulating substrate made of a resin material or the like, or a conductor layer-attached substrate that has a conductor layer formed on one or both sides of an insulating substrate. Examples of the material for the conductor layer of the conductor layer-attached substrate include metals such as copper, copper-based alloys, nickel, chromium, iron, and iron-based alloy such as stainless steel. Thereamong, copper, copper-based alloys and iron-based alloys are preferred.

Subsequently, on a surface of the substrate, a photosensitive layer that is a coating film of the above-described photosensitive resin composition is formed. Examples of the method of forming the photosensitive layer include a method in which a coating film is formed by coating a solution or a varnish containing the photosensitive resin composition onto the substrate by a known coating method, and the solvent is removed from the coating film; and a method of laminating the photosensitive layer of the above-described photosensitive element on the substrate. The thickness of the photosensitive layer formed on the substrate is usually in the range of from 10 μm in to 150 μm. The photosensitive layer is mainly constituted by the components of the solution, varnish or the like that remain after removal of the majority of the solvent.

In a case in which the photosensitive element is used to form a photosensitive layer, first, the protection film 13 of the photosensitive element 1 is peeled off. Then, the photosensitive element 1 is laminated on the substrate such that the photosensitive layer 12 faces the substrate, and the resultant is subjected to press-bonding with a hot roll laminator or the like. In this case, the press-bonding is preferably performed at a temperature of from about 70° C. to about 130° C. and a pressure of from about 0.1 MPa to about 1 MPa (from about 1 kgf/cm$^2$ to about 10 kgf/cm$^2$). From the standpoints of adhesion and conformability, the press-bonding is more preferably performed under reduced pressure. From the standpoint of improving the adhesion of the photosensitive layer 12 with the substrate, the substrate may be subjected to pre-heating or the like.

In the formation of a resist pattern, after forming the photosensitive layer 12 on the substrate in this manner, a photo-cured portion is formed on a prescribed portion of the photosensitive layer 12 by exposing the same with an active light beam (exposure step). Examples of the exposure method include a method of irradiating an active light beam in an imagewise manner through a negative or positive mask pattern that is referred to as an artwork. In a case in which the photosensitive layer 12 has, on the photosensitive layer 12, the support 11 of the photosensitive element 1, the exposure can be performed after peeling off the support 11, or if the support 11 is transparent to the active light beam, the exposure may be performed through the support 11. Further, the mask may be in a direct contact with the photosensitive layer 12, or may be in contact with the photosensitive layer 12 via a film capable of transmitting the active light beam.

As the light source of the active light beam used for the exposure, a known light source that effectively radiates ultraviolet ray or visible light may be suitably employed. Examples of the light source that effectively radiates ultraviolet ray include a carbon arc lamp, a mercury vapor arc lamp, an ultrahigh-pressure mercury lamp, a high-pressure mercury lamp and a xenon lamp, and examples of the light source that effectively radiates visible light include a photo-flood bulb and a solar lamp.

In a case in which the support 11, which originates from the photosensitive element 1, exists on the photosensitive layer 12 after the exposure, a resist pattern is formed by removing the support 11 and a development treatment is performed to remove the unexposed portion of the photosensitive layer 12, by way of wet development with a developer such as an aqueous alkaline solution, an aqueous developer or an organic solvent, or by way of dry development.

Examples of the aqueous alkaline solution used in the wet development include a dilute solution of 0.1% by mass to 5% by mass sodium carbonate, a dilute solution of 0.1% by mass to 5% by mass potassium carbonate, and a dilute solution of 0.1% by mass to 5% by mass sodium hydroxide. The aqueous alkaline solution preferably has a pH in the range of from 9 to 11, and its temperature is adjusted in accordance with the developing properties of the photosensitive layer. Further, the aqueous alkaline solution may include a surfactant, a defoaming agent, an organic solvent or the like.

Examples of the method for performing development include a dipping method, a spray method, blushing and slapping. As a post-development treatment, if necessary, heating at about 60° C. to about 250° C. or exposure at about 0.2 J/cm$^2$ to about 10 J/cm$^2$ may be performed. This can promote curing of the resist pattern, and further improve its durability in the subsequent steps such as a plating treatment.

(Method of Producing Wiring Board)

In the following, a method of producing a wiring board from a substrate on which a resist pattern is formed by the above-described method is described. Examples of the method of producing a wiring board include a method in which a portion that needs to be a conductor is formed by a plating treatment (additive method), and a method in which an unnecessary portion of a conductive layer formed on a substrate is removed by an etching treatment (subtractive method).

The additive method can be carried out by, for example, forming a resist pattern on a substrate not having a conductor layer on its surface (such as an insulating substrate as described above) by the above-described method, subjecting the resulting substrate to a plating treatment, and then removing the resist pattern. In this method, the resist pattern formed on the substrate is used as a plating resist. By performing the plating treatment, a circuit pattern having a desired shape can be formed at a portion of the substrate that is not covered with the resist pattern.

Examples of the plating method include copper plating such as copper sulfate plating and copper pyrophosphate plating; solder plating such as high-throw solder plating; nickel plating such as Watt bath (nickel sulfate-nickel chloride) plating and nickel sulfamate plating; tin sulfate plating; and gold plating such as hard gold plating and soft gold plating.

The subtractive method can be carried out by, for example, using a conductor layer-attached substrate as described above in connection with the method of forming a resist pattern, (1) a method in which a conductor layer-attached substrate on which a resist pattern is formed by a method of the above-described embodiment is subjected to an etching treatment and the resist pattern is subsequently removed, or (2) a method in which a conductor layer-attached substrate having a resist pattern formed thereon is subjected to a plating treatment and the resist pattern is subsequently removed, and then the unplated portion of the conductor layer is etched.

In the method (1), the resist pattern functions as an etching resist. A portion of the conductor layer at which an etching resist is not formed is removed by an etching treatment, and a circuit pattern having a desired shape is formed on the substrate.

In the method (2), first, the resist pattern functions as a plating resist, and a plating layer is formed at a portion of the conductor layer that is not covered with the plating resist. After the removal of the resist pattern, this plating layer functions as an etching resist, and a portion of the conductor layer at which a plating layer is not formed is removed by an etching treatment, and a circuit pattern having a desired shape is formed. In this case, the plating treatment can be performed in the same manner as the method performed in the additive method as described above.

In these methods, the etching treatment can be performed by using a known etching solution to dissolve and remove the conductor layer. Examples of the etching solution include a cupric chloride solution, a ferric chloride solution, an alkaline etching solution and a hydrogen peroxide-based etching solution. As the etching solution, a ferric chloride solution is preferred in view of its favorable etching factor. In the case of the method (2), it is preferred to select and use an etching solution that has a solubility that can selectively remove the portion other than the plating layer.

Further, in these methods, removal of the resist pattern can be performed by, for example, peeling off the resist pattern with an alkaline aqueous solution that is more alkaline than the alkaline aqueous solution used in the development step in the resist pattern formation. Examples of the strong alkaline aqueous solution include an aqueous solution of 1% by mass to 10% by mass sodium hydroxide and an aqueous solution of 1% by mass to 10% by mass potassium hydroxide. Examples of the method for peeling include immersion and spraying, and these methods may be used singly or in combination of two or more thereof.

The resist used for the plating treatment or the etching treatment in the methods of producing a wiring board as described above is made of a resist pattern that is formed from the above-described photosensitive resin composition. As described above, this resist pattern exhibits a high resolution and a favorable adhesion with respect to a conductor layer made of metal or the like, and is highly unlikely to cause discoloration of a conductor layer even when it is subjected to a plating treatment or the like. Therefore, according to these production methods, it becomes easier to produce a wiring board having a circuit pattern that is fine in pattern and has a favorable line edge shape, and is highly unlikely to cause surface discoloration and the like can be easily produced.

EXAMPLES

In the following, the present invention is described in detail by way of the Examples. However, the present invention is not restricted to these Examples. Unless otherwise noted, the compounds used in the Examples are reagents.

Preparation of Photosensitive Resin Composition

Examples 1 to 6 and Comparative Examples 1 to 6

A binder polymer was synthesized in the following manner. To a flask equipped with a stirrer, a reflux condenser, a thermometer, a dropping funnel and a nitrogen gas-introducing tube, 500 g of a mixed solvent of methyl cellosolve and toluene at a mass ratio of 3:2 were loaded. The mixed solvent was stirred while blowing nitrogen gas thereinto, and heated to 80° C.

Meanwhile, a solution containing 100 g of methacrylic acid, 200 g of ethyl methacrylate, 100 g of ethyl acrylate, 100 g of styrene and 0.8 g of azobis-isobutyronitrile as monomers to be copolymerized (hereinafter, referred to as "solution (a)") was prepared, and this solution (a) was added dropwise over 4 hours to the mixed solvent heated to 80° C. Then, the resulting mixture was stirred for 2 hours while maintaining the temperature at 80° C.

Further, a solution prepared by dissolving 1.2 g of azobis-isobutyronitrile in 100 g of the mixed solvent was added dropwise to the flask over 10 minutes. Then, the resulting solution was maintained at 80° C. with stirring for 3 hours, and the temperature was raised to 90° C. over 30 minutes. After maintaining the temperature at 90° C. for 2 hours, the solution was cooled to obtain a binder polymer solution. Acetone was added to the obtained solution to adjust the nonvolatile content (solid) to be 45% by mass.

The weight-average molecular weight of the obtained binder polymer was 80,000. The weight-average molecular weight was measured by gel permeation chromatography (GPC) and calculated based on a standard polystyrene calibration curve. The GPC conditions were as follows.

<GPC Measurement Conditions>
Apparatus: Hitachi L6000
Detector: L3300 RI
Column: GELPACK GL-R440+GL-R450+GL-R400M (all of which are manufactured by Hitachi Chemical Co., Ltd., trade names)
Column specification: 10.7 mmφ×300 mm
Sample concentration: 120 mg of a solution of the binder polymer prepared to have a nonvolatile content of 40% was recovered and dissolved in 5 mL of THF (concentration: 120 mg/5 mL)
Injection volume: 200 μL
Pressure: 4.8 MPa (49 kgf/cm$^2$)
Flow rate: 2.05 mL/min Next, the obtained binder polymer solution was mixed with the components having the respective amounts (unit: gram) shown in Table 1, and the photosensitive resin compositions of Examples 1 to 6 and Comparative Examples 1 to 6 were prepared. In the following, the mixed amount of the binder polymer corresponds to the amount of the nonvolatile content.

TABLE 1

| Component | | Example 1 | Example 2 | Example 3 | Example 4 | Example 5 | Example 6 |
|---|---|---|---|---|---|---|---|
| Binder polymer | | 60 | 60 | 60 | 60 | 60 | 60 |
| Photopolymerizable | FA-321M | 30 | 30 | 30 | 30 | 30 | 30 |
| compound | APG400 | 10 | 10 | 10 | 10 | 10 | 10 |
| Photopolymerization | Benzophenone | 5 | 5 | 5 | — | — | — |
| initiator | B-CIM | — | — | — | 3.5 | 3.5 | 3.5 |
| | EAB | 0.2 | 0.2 | 0.2 | 0.2 | 0.2 | 0.2 |

TABLE 1-continued

| Component | | | | | | | |
|---|---|---|---|---|---|---|---|
| Coloring agent | LCV | 1 | 1 | 1 | 0.5 | 0.5 | 0.5 |
|  | TPS | 1 | 1 | 1 | — | — | — |
| Benzotriazole compound | 1H-benzotriazole | 0.05 | 0.05 | 0.05 | 0.05 | 0.05 | 0.05 |
|  | 1H-benzotriazole-5-carboxylic acid | 0.005 | 0.005 | 0.005 | 0.005 | 0.005 | 0.005 |
| Diamine compound | Diamine 1 | 0.005 | 0.005 | — | 0.005 | 0.005 | — |
|  | Diamine 2 | — | — | 0.005 | — | — | 0.005 |
| Monoamine compound | bis(2-ethylhexyl)amine | 0.005 | — | 0.005 | 0.005 | — | 0.005 |
|  | Diisopropanolamine | — | 0.005 | — | — | 0.005 | — |
| Tetrazole compound/ Triazole compound | 5-aminotetrazole | 0.003 | 0.003 | 0.003 | 0.003 | 0.003 | 0.003 |
|  | 3-aminotriazole | — | — | — | — | — | — |
| 1-[N,N-bis(2-ethylhexyl)aminomethyl]benzotriazole-5-carboxylic acid | | — | — | — | — | — | — |
| 1-[(3-octadecenylaminopropylamino)methyl]benzotriazole-5-carboxylic acid | | — | — | — | — | — | — |
| Dye | Malachite green | 0.05 | 0.05 | 0.05 | 0.05 | 0.05 | 0.05 |

| Component | | Comparative Example 1 | Comparative Example 2 | Comparative Example 3 | Comparative Example 4 | Comparative Example 5 | Comparative Example 6 |
|---|---|---|---|---|---|---|---|
| Binder polymer | | 60 | 60 | 60 | 60 | 60 | 60 |
| Photopolymerizable compound | FA-321M | 30 | 30 | 30 | 30 | 30 | 30 |
|  | APG400 | 10 | 10 | 10 | 10 | 10 | 10 |
| Photopolymerization initiator | Benzophenone | — | 5 | — | 5 | 5 | 5 |
|  | B-CIM | 3.5 | — | 3.5 | — | — | — |
|  | EAB | 0.2 | 0.2 | 0.2 | 0.2 | 0.2 | 0.2 |
| Coloring agent | LCV | 0.5 | 1 | 0.5 | 1 | 1 | 1 |
|  | TPS | — | 1 | — | 1 | 1 | 1 |
| Benzotriazole compound | 1H-benzotriazole | 0.15 | 0.15 | 0.05 | 0.05 | 0.05 | 0.05 |
|  | 1H-benzotriazole-5-carboxylic acid | 0.008 | — | — | 0.1 | — | — |
| Diamine compound | Diamine 1 | — | — | — | — | — | — |
|  | Diamine 2 | — | — | — | — | — | — |
| Monoamine compound | bis(2-ethylhexyl)amine | 0.006 | — | — | — | — | — |
|  | Diisopropanolamine | — | — | — | — | — | — |
| Tetrazole compound/ Triazole compound | 5-aminotetrazole | 0.003 | — | — | — | — | — |
|  | 3-aminotriazole | — | — | — | — | — | — |
| 1-[N,N-bis(2-ethylhexyl)aminomethyl]benzotriazole-5-carboxylic acid | | — | — | — | — | 0.1 | — |
| 1-[(3-octadecenylaminopropylamino)methyl]benzotriazole-5-carboxylic acid | | — | — | — | — | — | 0.1 |
| Dye | Malachite green | 0.05 | 0.05 | 0.05 | 0.05 | 0.05 | 0.05 |

The abbreviations and the like used in Table 1 are as follows.

FA-321M: EO-modified bisphenol A dimethacrylate; EO average addition amount: 10 mol, manufactured by Hitachi Chemical Co., Ltd., a compound represented by the Formula (3).

APG400: polypropylene glycol diacrylate; average number of propyleneoxy structural units: 7, manufactured by Shin-Nakamura Chemical Co., Ltd., a compound represented by the Formula (4).

B-CIM: 2-(2-chlorophenyl)-4,5-diphenylimidazole dimer
EAB: N,N,N',N'-tetraethyl-4,4'-diaminobenzophenone
LCV: Leuco crystal violet
TPS: tribromomethylphenylsulfone
Diamine 1: beef tallow alkyl-trimethylene diamine (manufactured by Kao Corporation, trade name: DIAMINE RRT)
Diamine 2: beef tallow alkyl-propylene diamine (manufactured by NOF Corporation, trade name: NISSAN AMINE DT)

(Preparation of Photosensitive Element)

The photosensitive resin compositions obtained above were subjected to a defoaming treatment for one hour with a defoaming device, and the resultant is applied onto a 16 μm-thick polyethylene terephthalate (PET) film (manufactured by Teijin DuPont Films Japan Ltd., trade name: G2) with a comma coater to form a coating film. Subsequently, the coating film was dried at 95° C. for 10 minutes to form a 40 μm-thick photosensitive layer. On this photosensitive layer, a 19 μm-thick polyethylene film (manufactured by Tamapoly Co., Ltd., trade name: NF-13) was laminated as a protection film. The photosensitive elements of Examples 1 to 6 and Comparative Examples 1 to 6 were thus obtained, respectively.

[Evaluation of Properties]
(Formation of Resist Pattern)

First, a copper-clad laminated board having a copper foil on both sides of a substrate (manufactured by Hitachi Chemical Co., Ltd., trade name: MCL E-67) was prepared, and the surface of the copper foil was polished with a buffing machine and washed with water. Then, after peeling off the protection film from the photosensitive element as described above, the photosensitive element was placed on the copper-clad laminated board such that the photosensitive layer was in contact with the surface of one of the copper foils. Thereafter, the resultant was heat-pressed at 110° C. with a dry film laminator (A60, manufactured by Hitachi Chemical Co., Ltd.), thereby obtaining a laminated body having a constitution in which the photosensitive layer and the PET film were disposed in this order on the copper-clad laminated board.

An exposure treatment of the photosensitive layer was performed by exposing the obtained laminated body to an active light beam from the side of the PET film through a negative mask having a prescribed pattern. In this process, a 5-kW high-pressure mercury lamp (HMW-201GX, manufactured by ORC Manufacturing Co., Ltd.) was used as the light source of the active light beam. After the exposure treatment, the PET film was removed from the laminated body, and a development treatment was performed by spraying an aqueous solution of 1% by mass sodium carbonate to the photosensitive layer for 30 seconds (spray pressure: 0.2 MPa), thereby forming a resist pattern.

(Evaluation of Adhesion of Resist Pattern)

An end portion of the resist pattern formed on the laminated body was observed with a scanning electron microscope (SEM), and whether or not detachment of the resist pattern occurred was examined. The less the occurrence of detachment of the resist pattern is, the stronger the adhesion of the resist pattern is. The results are shown in Table 3. Table 3 shows the results of evaluating the existence and the extent of detachment of the resist pattern at its end portion based on the three-scale criteria of A, B and C, as described below.

—Evaluation Criteria—

A: No detachment of the end portion of the resist pattern was observed.

B: Detachment of the resist pattern was observed, and the distance between the detached end portion and the copper foil was less than 5 μm.

C: Detachment of the resist pattern was observed, and the distance between the detached end portion and the copper foil was 5 μm or greater.

(Evaluation of Resolution of Resist Pattern)

The shape of the resist pattern formed on the laminated body was observed with a scanning electron microscope (SEM). By comparing the width of an uppermost portion of the resist pattern (W1) and the width of the resist pattern at a portion at which the resist pattern contacted the copper foil (W2), the existence and the extent of a skirt shape of the resist pattern (a phenomenon in which W2 is greater than W1) were evaluated. The more the formation of a skirt shape is suppressed, the less likely the detachment or the like during plating occurs and the higher the resolution is. The results are shown in Table 3. Table 3 shows the results of evaluating the extent of the phenomenon based on the three-scale criteria of A, B and C, as described below.

—Evaluation Criteria—

A: Formation of a skirt shape was hardly observed.

B: The value of (W2/W1)×100 was greater than 100 but 105 or less.

C: The value of (W2/W1)×100 was greater than 105.

(Evaluation of Peeling Property of Resist Pattern)

The laminated body on which the resist pattern was formed was left to stand at room temperature (25° C.) for a whole day, and the resist pattern was peeled off under the conditions shown in Table 2. Thereafter, the size (maximum length) of a peeled piece was visually observed and evaluated based on the following criteria. The smaller the size of the peeled piece is, the better the peeling property is.

—Evaluation Criteria—

A: 20 mm or smaller (fragmented)

B: More than 20 mm but 40 mm or less (the pattern portion was in the form of a short string)

C: Sheet form (the peeled piece was not broken, or the pattern portion was in the form of a long string)

TABLE 2

| Process | |
|---|---|
| Exposure | Exposure apparatus: manufactured by ORC Manufacturing Co., Ltd. Product name: "HMW-201GX" (Light source: 5-kW high-pressure mercury lamp) Exposure dose: 60 mJ/cm² |

TABLE 2-continued

| Process | |
|---|---|
| Development | Developer: aqueous solution of 1% by mass sodium carbonate Solution temperature: 30° C. Spray method |
| Peeling | Peeling solution: aqueous solution of 3% by mass sodium hydroxide Solution temperature: 50° C. dip-stirring is performed |

(Evaluation of Substrate Discoloration)

A region of the laminated body on which the resist pattern was formed, at which a circuit pattern was to be formed, was observed and whether or not discoloration of the copper foil on the substrate occurred as compared to a copper-clad laminated board, prior to performing the treatment. The results are shown in Table 3. Table 3 shows the results of evaluating discoloration of the copper foil based on the four-scale criteria of A, B, C and D, as described below.

—Evaluation Criteria—

A: No discoloration was observed.

B: The color changed to pale reddish brown.

C: The color changed to reddish brown.

D: The color changed to brown.

(Evaluation of Plating Bath Contamination)

The laminated body on which the resist pattern was formed was immersed in an aqueous solution of an acidic degreasing agent at 40° C. for 60 seconds, and spray-washed with water. Subsequently, the laminated body was immersed in an aqueous solution of approximately 1% by mass ammonium persulfate for 60 seconds and spray-washed with water, and was further immersed in an aqueous solution of approximately 15% by mass sulfuric acid for 60 seconds. Thereafter, the laminated body was placed in a copper sulfate plating bath (copper sulfate: 75 g/L, sulfuric acid: 190 g/L, chlorine ion: 50 ppm, temperature: 25° C.) and copper plating was performed at 2M A/dm² for 60 minutes.

immediately after the completion of the copper plating, the laminated body on which a resist pattern was formed was washed with water and immersed in an aqueous solution of approximately 15% by mass hydrofluoroboric acid. Then, the laminated body was placed in a solder plating bath (45% by mass zinc fluoroborate: 22 mL/L, 42% by mass hydrofluoroboric acid: 200 mL/L, temperature: 25° C.) and solder plating was performed at 1.5 A/dm² for 20 minutes, followed by washing with water. After removing the resist pattern from the plated laminated body, the copper foil at the unplated portion was removed by etching, thereby obtaining a wiring board. The results are shown in Table 3. Table 3 shows the results of evaluating a state of deposition of plating, based on the three-scale criteria of A, B and C, as described below.

—Evaluation Criteria—

A: No abnormal deposition was observed.

B: Deposition was observed, but the deposition time was insufficient under the aforementioned conditions.

C: Defects in deposition were observed and the deposition thickness was uneven.

TABLE 3

| | | Examples | | | | | | Comparative Examples | | | | | |
|---|---|---|---|---|---|---|---|---|---|---|---|---|---|
| | | 1 | 2 | 3 | 4 | 5 | 6 | 1 | 2 | 3 | 4 | 5 | 6 |
| Photosensitive characteristics | Adhesion | B | B | B | A | A | A | C | B | A | C | B | B |
| | Resolution | B | B | B | A | A | A | B | C | B | C | B | B |
| | Peeling property | A | A | A | A | A | A | C | C | C | B | A | A |
| Substrate properties | Substrate discoloration | A | A | A | A | A | A | C | D | D | B | A | A |
| | Contamination of plating bath | A | A | A | A | A | A | B | C | C | C | B | B |

As shown in Table 3, by using the photosensitive resin compositions of Examples 1 to 6, a resist pattern that exhibits excellent adhesion to a copper foil and excellent plating resistance, and hardly causes discoloration of a copper foil, can be formed. On the other hand, it is found that a resist pattern that is formed by any of the photosensitive resin compositions of Comparative Examples 1 to 6 is insufficient in adhesion with respect to a copper foil or tends to cause, for example, discoloration of a copper foil or defective plating deposition due to contamination of a plating solution.

The disclosure of Japanese Patent Application No. 2012-125516 is hereby incorporated by reference in its entirety.

All the references, patent applications and technical standards that are described in the present specification are hereby incorporated by reference to the same extent as if each individual reference, patent application or technical standard is concretely and individually described to be incorporated by reference.

The invention claimed is:

1. A photosensitive resin composition, comprising:
   a binder polymer;
   a photopolymerizable compound having an ethylenically unsaturated group;
   a photopolymerization initiator;
   a benzotriazole compound; and
   an aliphatic diamine compound having from 8 to 30 carbon atoms.

2. The photosensitive resin composition according to claim 1, further comprising at least one selected from the group consisting of triazole compounds and tetrazole compounds.

3. A photosensitive element, comprising:
   a support; and
   a photosensitive layer that is formed on the support and is a coating film composed of the photosensitive resin composition according to claim 2.

4. A method of forming a resist pattern, the method comprising:
   a lamination step of laminating the photosensitive element according to claim 3 on a substrate such that the photosensitive layer faces the substrate;
   an exposure step of exposing at least a portion of the photosensitive layer to an active light beam to form a photo-cured portion in the photosensitive layer; and
   a development step of removing a portion other than the photo-cured portion.

5. A method of forming a resist pattern, the method comprising:
   a photosensitive layer-forming step of forming a photosensitive layer on a substrate by applying the photosensitive resin composition according to claim 2.

6. A photosensitive element, comprising:
   a support; and
   a photosensitive layer that is formed on the support and is a coating film composed of the photosensitive resin composition according to claim 1.

7. A method of forming a resist pattern, the method comprising:
   a lamination step of laminating the photosensitive element according to claim 6 on a substrate such that the photosensitive layer faces the substrate;
   an exposure step of exposing at least a portion of the photosensitive layer to an active light beam to form a photo-cured portion in the photosensitive layer; and
   a development step of removing a portion other than the photo-cured portion.

8. A method of producing a wiring board, the method comprising a step of performing an etching treatment or a plating treatment on a substrate on which a resist pattern is formed by the method of forming a resist pattern according to claim 7.

9. A method of forming a resist pattern, the method comprising:
   a photosensitive layer-forming step of forming a photosensitive layer on a substrate by applying the photosensitive resin composition according to claim 1;
   an exposure step of exposing at least a portion of the photosensitive layer to an active light beam to form a photo-cured portion in the photosensitive layer; and
   a development step of removing a portion other than the photo-cured portion.

10. A method of producing a wiring board, the method comprising a step of performing an etching treatment or a plating treatment on a substrate on which a resist pattern is formed by the method of forming a resist pattern according to claim 9.

* * * * *